(12) United States Patent
Ehm et al.

(10) Patent No.: US 11,022,893 B2
(45) Date of Patent: Jun. 1, 2021

(54) OPTICAL ASSEMBLY WITH A PROTECTIVE ELEMENT AND OPTICAL ARRANGEMENT THEREWITH

(71) Applicant: Carl Zeiss SMT GmbH, Oberkochen (DE)

(72) Inventors: Dirk Heinrich Ehm, Beckingen (DE); Stefan-Wolfgang Schmidt, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 262 days.

(21) Appl. No.: 15/965,913

(22) Filed: Apr. 28, 2018

(65) Prior Publication Data

US 2018/0246413 A1    Aug. 30, 2018

Related U.S. Application Data

(63) Continuation of application No. PCT/EP2016/075845, filed on Oct. 26, 2016.

(30) Foreign Application Priority Data

Oct. 29, 2015   (DE) .......................... 102015221209.2

(51) Int. Cl.
*G03F 7/20* (2006.01)
*G02B 5/08* (2006.01)
(Continued)

(52) U.S. Cl.
CPC .......... *G03F 7/70175* (2013.01); *G02B 1/14* (2015.01); *G02B 1/18* (2015.01); *G02B 5/0891* (2013.01);
(Continued)

(58) Field of Classification Search
CPC ............... G03F 7/7015; G03F 7/70175; G03F 7/70075; G03F 7/70916
See application file for complete search history.

(56) References Cited

U.S. PATENT DOCUMENTS 6,445,844 B1   9/2002  Neukermans et al.
6,594,073 B2   7/2003  Wang
(Continued)

FOREIGN PATENT DOCUMENTS

DE    102012204295 A1   3/2013
EP       1791027 A1   5/2007
(Continued)

OTHER PUBLICATIONS

International Search Report and Written Opinion in counterpart International Application No. PCT/EP2016/075845, dated Feb. 3, 2017, 12 pages.

(Continued)

*Primary Examiner* — Daborah Chacko-Davis
(74) *Attorney, Agent, or Firm* — Edell, Shapiro & Finnan, LLC

(57) ABSTRACT

An optical assembly includes an optical element (13), configured in particular for the reflection of EUV radiation (4), and a protective element (30) for protecting a surface (31) of the optical element (13, 14) from contaminating substances (P). The protective element (30) has a membrane (33*a*-*c*) and a frame (34) on which the membrane (33*a*-*c*) is mounted. The membrane is formed by a plurality of membrane segments (33*a*, 33*b*, 33*c*) which respectively protect a partial region (T) of the surface (31) of the optical element (13) from the contaminating substances (P). The optical assembly can form part of an overall optical arrangement, for example an EUV lithography system.

24 Claims, 2 Drawing Sheets

(51) Int. Cl.
- *G03F 1/64* (2012.01)
- *G02B 26/08* (2006.01)
- *G03F 1/62* (2012.01)
- *G02B 1/14* (2015.01)
- *G02B 1/18* (2015.01)

(52) U.S. Cl.
CPC .......... *G02B 26/0841* (2013.01); *G03F 1/62* (2013.01); *G03F 1/64* (2013.01); *G03F 7/70075* (2013.01); *G03F 7/70116* (2013.01); *G03F 7/70916* (2013.01)

(56) References Cited

U.S. PATENT DOCUMENTS

| | | | |
|---|---|---|---|
| 6,701,512 | B2 | 3/2004 | Sutani et al. |
| 7,829,248 | B2 | 11/2010 | Lin et al. |
| 8,477,285 | B2 | 7/2013 | Ehm et al. |
| 10,001,631 | B2 | 6/2018 | Bittner et al. |
| 2002/0100012 | A1 | 7/2002 | Sutani et al. |
| 2002/0181092 | A1 | 12/2002 | Wang |
| 2005/0120953 | A1 | 6/2005 | Banine et al. |
| 2008/0259298 | A1 | 10/2008 | Banine et al. |
| 2010/0195076 | A1 | 8/2010 | Mueller et al. |
| 2011/0309271 | A1 | 12/2011 | Moriya et al. |
| 2012/0262689 | A1 | 10/2012 | Van Ingen Schenau et al. |
| 2013/0088699 | A1 | 4/2013 | Yakunin et al. |
| 2014/0065525 | A1 | 3/2014 | Yamada et al. |
| 2015/0160569 | A1* | 6/2015 | Osorio Oliveros .... G21K 1/062 430/5 |
| 2015/0234281 | A1 | 8/2015 | Gardner et al. |
| 2016/0033860 | A1* | 2/2016 | Wiley ........................ G03F 1/64 355/67 |

FOREIGN PATENT DOCUMENTS

| | | |
|---|---|---|
| JP | 2008153396 A | 7/2008 |
| JP | 2010525570 A | 7/2010 |
| JP | 2013516055 A | 5/2013 |
| JP | 2013534727 A | 9/2013 |
| JP | 2014049677 A | 3/2014 |
| TW | I251118 B | 3/2006 |
| TW | 201337324 A | 9/2013 |
| TW | 201430503 A | 8/2014 |

OTHER PUBLICATIONS

Office Action in corresponding German Application 1020152212092, dated May 10, 2016, along with English Translation.

JP Office Action, Application No. 2018-522015, dated Aug. 4, 2020, with English translation (4 pages total).

TW Search Report, Application No. 105134737, dated Feb. 8, 2021, 2 pages.

TW Office Action with English translation, Application No. 105134737, dated Mar. 30, 2021, 14 pages.

\* cited by examiner

OPTICAL ASSEMBLY WITH A PROTECTIVE ELEMENT AND OPTICAL ARRANGEMENT THEREWITH

CROSS-REFERENCE TO RELATED APPLICATION

This is a Continuation of International Application PCT/EP2016/075845 which has an international filing date of Oct. 26, 2016, and the disclosure of which is incorporated in its entirety into the present Continuation by reference. The following disclosure is also based on and claims the benefit of and priority under 35 U.S.C. § 119(a) to German Patent Application 10 2015 221 209.2, filed Oct. 29, 2015, the entire disclosure of which is considered part of and is incorporated by reference into the disclosure of this Continuation application.

FIELD OF THE INVENTION

The invention relates to an optical assembly comprising: an optical element, in particular for the reflection of EUV radiation, and a protective element for protecting a surface of the optical element from contaminating substances, the protective element comprising a membrane and a frame on which the membrane is mounted. The invention also relates to an optical arrangement, for example an EUV lithography system, with at least one such optical assembly.

BACKGROUND

For the purposes of this application, an EUV lithography system is understood as meaning an optical system or an optical arrangement for EUV lithography, i.e. an optical system that can be used in the field of EUV lithography. Apart from an EUV lithography apparatus, which serves for the production of semiconductor components, the optical system may be for example an inspection system for the inspection of a photomask used in an EUV lithography apparatus (hereinafter also referred to as a reticle), for the inspection of a semiconductor substrate to be structured (hereinafter also referred to as a wafer) or a metrology system, which is used for measuring an EUV lithography apparatus or parts thereof, for example for measuring a projection system.

When using EUV radiation at wavelengths in the range between about 5 nm and about 30 nm, for example in EUV lithography apparatuses, the contamination of optical elements by contaminating substances presents a particular problem. Contaminating substances may be produced for example in an EUV light source in which a target material, for example in the form of tin droplets, is used for generating the EUV radiation. The target material in the form of tin droplets may be transformed into a plasma state by a laser beam, whereby the tin droplets partially evaporate and tin particles are produced. The tin particles can spread out in the EUV lithography apparatus and be deposited either directly or in the form of a layer of tin on the optical surface of optical elements, for example in the illumination system or in the projection system, and also on mechanical or mechatronic components of the EUV lithography apparatus.

The contamination of the surfaces by tin particles can take place in various ways: The tin particles may be deposited on the optical surfaces directly from the gas phase or a layer of tin may be produced by surface diffusion of tin. Contaminations by tin can also be caused by outgassing effects on tin-containing components in the EUV lithography apparatus that are induced by hydrogen or a hydrogen plasma present in the EUV lithography apparatus. The depositing of tin on the optical surfaces of the optical elements may also bring about blistering in a reflective coating of the optical elements, which in the worst case has the consequence of delamination of the coating. Mechatronic components may also be greatly restricted in their functioning or destroyed by penetrating Sn particles.

It is known to protect masks or wafers that are used in lithography systems from contaminating substances with the aid of protective elements in the form of so-called pellicles. A pellicle is a membrane which consists of a material that is transparent, or as unabsorbent as possible, with respect to the radiation at the wavelength of the lithography system. In particular when using EUV radiation, the thickness of such a pellicle is typically small, in order to keep the absorption of the radiation passing through the pellicle as low as possible.

U.S. Pat. No. 7,829,248 B2 discloses a mask-pellicle system for lithography in which a pellicle is arranged in the vicinity of a transparent substrate of the mask. The pellicle is fastened to a frame, which rests on the mask. Mounted on the frame is a device that absorbs mechanical stresses. The frame has at least two segments, which are connected to one another at an angle in order to protect the stress-absorbing device from radiation energy from the lithography process.

EP 1 791 027 A1 describes a lithography apparatus for immersion lithography, which has a supporting table for holding an object, for example a substrate. In order to minimize the formation of bubbles in the immersion medium, a gap between the object and the supporting table is to be minimized. For this purpose, a covering plate may be provided and in one example is formed as a pellicle that is mounted on the outside of the supporting table. In another example, the covering plate is segmented, the segments of the covering plate sliding over one another.

US 2010/0195076 A1 has disclosed an optical membrane element for a lithography device, said membrane element comprising at least one membrane layer and a frame, which at least partially surrounds the at least one membrane layer and to which at least part of the edge of the membrane layer is fastened. At least one tensioning element is provided for clamping the membrane in an adjustable manner. In an EUV lithography apparatus, the membrane element may be arranged for example in front of a mirror of an illumination system and serve as a neutral grey filter.

SUMMARY

An object of the invention is to provide an optical assembly and an optical arrangement, in particular an EUV lithography system, with at least one such optical assembly, in which an optical element that has a comparatively large surface to be protected can be effectively protected from contaminating substances According to one formulation this object is achieved by an optical assembly of the type describe above, in which the membrane comprises a plurality of membrane segments, which respectively protect a partial region of the surface of the optical element from contaminating substances. When the optical element is arranged in an optical arrangement for EUV lithography, the membrane may additionally protect the optical element from a plasma caused by EUV radiation in the vacuum environment thereof. When using a one-part membrane for protecting a surface from contaminating substances, there is the problem that such a membrane cannot be readily produced with any desired surface area.

There is also the problem that, because of its small thickness, the membrane is not self-supporting, and so has a tendency to bend, the bending typically being all the greater the larger the surface of the membrane is. In US 2010/0195076 A1, noted above, it is proposed to counteract the bending of the membrane by the membrane being laterally clamped. In US 2010/0195076 A1 it is stated that such a membrane typically does not exceed a maximum edge length of 200 mm. Large optical elements however have a surface or an edge length that can exceed 200 mm, and so the surface of such an optical element typically cannot be completely protected from contaminating substances with a one-part membrane.

Using a multi-part membrane, i.e. a membrane that has a plurality of membrane segments, allows the area or the surface region that is protected from contaminating substances by the protective element to be increased significantly in size. The membrane segments are typically mounted on a common frame, which has a much greater thickness than the membrane and is self-supporting. The plurality of membrane segments that are mounted in the frame typically cover the optical surface completely, or at least that partial region of the optical surface on which radiation, for example EUV radiation, is incident.

In particular when using EUV radiation, there is the problem that no materials that are substantially transparent to the wavelengths of less than 13.5 nm used in that case exist. The frame, which typically has a much greater thickness than the membrane, is therefore generally not transparent to the EUV radiation, irrespective of the choice of material. The frame, to be more precise the parts of the frame that are arranged in the beam path, consequently shade the surface of the optical element in a partial region corresponding to the projection of the frame onto the surface.

In one embodiment, the frame has a plurality of webs for the fastening of the respective membrane segments at the edges. The frame, to be more precise the webs of the frame, surround the respective membrane segments at least partially, in particular completely. Generally, a respective membrane segment rests with its edge completely on the webs or is fastened at its edge to the webs. The membrane segments may be fastened to the webs of the frame by an adhesive connection or in some other way. The webs may be formed in the manner of a raster or a grid, the membrane segments being arranged in the meshes between the webs of the grid. The frame or the webs of the frame may be formed from a material suitable for vacuum environments, such as for example high-grade steel, a metal such as aluminum, etc. The frame may be formed in particular as a wire grid.

In order to keep the shading of the optical element by the frame as low as possible, the webs of the frame should have a width that is as small as possible, on the other hand the width should be sufficient for the fastening of the membrane segments. Typically, an edge of a membrane segment is respectively fastened on two longitudinal sides of a web lying opposite one another. Ideally, the edges of two adjacent membrane segments lie flush against one another at a respective web, and so the segmented membrane covers the entire surface to be protected of the optical element in a planar manner. It is also possible that the edges of adjacent membrane segments are fastened to a web at a distance from one another, so that the web is not completely covered by the membrane, but the surface is nevertheless covered in a planar manner. In this case, at least the partial region of the web between the membrane segments is exposed to contaminating substances. For protection from the contaminating substances, the web may possibly be provided at least in the non-covered partial region with a coating. Two membrane segments that are mounted on a web may possibly overlap one another.

In one embodiment, the optical element has at least one actuator for moving at least one partial region of the surface. The optical element may be for example a mirror, the (optical) surface of which is tilted, or possibly linearly displaced, with the aid of the actuator. Such a mirror may however also have a number of partial regions that can be moved individually, for example tilted or displaced. With such actuable mirrors, there is in principle the problem that partial regions of the actuator that are arranged in the region of the surface possibly come into contact with the contaminating substances and are impaired in their functioning.

In one embodiment, the optical element is a segmented mirror with a plurality of mirror segments, in particular a facet mirror with a plurality of facet elements. A segmented mirror comprises a plurality of mirror segments, each forming a partial region of the mirror surface, the mirror segments being typically arranged adjacent to each other. The mirror segments may be actuable individually, for example tilted or displaced, or the mirror segments may not be actuable at all. The latter may be the case when the surface area of the mirror is too large so that it cannot be manufactured as one piece.

Facet mirrors constitute a special case of segmented mirrors which are used for example in illumination systems of EUV lithography apparatuses in order to produce a homogenization of the radiation generated by an EUV light source on an illumination area that is illuminated by the illumination system. Such facet mirrors often have at least in one spatial direction a comparatively great edge length, which may for example be several 100 mm to 1000 mm, or possibly more, and so the surface of such a facet mirror generally cannot be protected by a one-piece membrane. For example, such a facet mirror may have a linear extent (length×width) of more than 800 mm×800 mm, which is typically too large to be covered by a one-piece membrane. Although the following description relates to facet mirrors and facet elements one skilled in the art will readily understand that the principles described below are also applicable to the more general case of segmented mirrors.

The facet elements of such a facet mirror can in general be actuated with the aid of actuators, i.e. can be individually moved, in particular tilted. The facet mirror typically has mechanical or mechatronic components as actuators. For this purpose, the facet mirror may for example be formed as an MEMS ("micro-electro-mechanical system") mirror. The electromechanical components on the surface of such a facet mirror are not covered—in particular when individual facet elements are tilted—and are exposed to the contaminating substances, which may have the effect that their function is impaired, which can be prevented by the protective element.

In a development, the geometry of the frame is adapted to the geometry of the facet elements. The geometry of the facet elements is typically adapted to the illumination field to be illuminated. The facet elements may for example have a rectangular, square, hexagonal . . . geometry. If the facet elements have for example a rectangular or square geometry, the geometry of the frame is in this case also correspondingly adapted, i.e. the webs of the frame are likewise arranged in rows and columns.

In a further embodiment, the webs of the frame are arranged over intermediate spaces between the facet elements. Between adjacent facet elements of the facet mirror there is typically formed an intermediate space, in which the incident radiation is not reflected by the facet elements.

Since, when using EUV radiation, the webs of the frame are not transparent to the incident radiation, it is advantageous if the webs, to be more precise the "shadow" of the webs in the projection onto the surface to be protected, falls in the intermediate spaces between the facet elements, since no radiation is reflected from the facet mirror there in any case. It proves to be advantageous here if the protective element is arranged at a small distance in front of the surface to be protected, since in this case the position of the shadow cast by the webs of the frame is substantially independent of the direction in which the radiation to be reflected is incident on the facet mirror. In this exemplary embodiment, the webs should have a width that is less than the width of the intermediate spaces between the facet elements over which the webs are arranged.

In a further embodiment, the (segmented) membrane is arranged at a distance of less than 10 mm, preferably of less than 5 mm, particularly preferably of less than 2 mm, from the surface of the optical element. In the case of an optical element in the form of a facet mirror, the surface from which the distance is measured is the plane in which the facet elements in the untilted state are arranged. As described further above, a small distance has an advantageous effect on the shading of the facet mirror by the webs of the frame. However, the distance should be chosen to be sufficiently great to avoid the facet elements colliding with the membrane or with the webs of the frame during tilting.

In a further embodiment, the linear extent of a membrane segment corresponds substantially to an integral multiple (typically other than one) of the linear extent of a facet element. It is typically not absolutely necessary that a respective membrane segment covers only a single facet element; rather, a single membrane segment may cover a number of facet elements, for example a group of N×M facet elements. In this case, the linear extent of the membrane segment in two directions perpendicular to one another corresponds (approximately) to N times or M times the linear extent of a respective facet element. Since intermediate spaces are formed between the facet elements, the linear extent of a membrane segment is typically somewhat greater than an integral multiple of a single facet element, the deviation typically being no greater than about 20%, preferably no greater than 10%. A substantially integral multiple of the linear extent of the facet element is understood as meaning such a deviation of the linear extent of the membrane segment.

Ideally, the linear extent in the longitudinal direction of at least one membrane segment corresponds to an integral multiple of the sum of the length of a facet element and the distance in the longitudinal direction between adjacent facet elements. Correspondingly, the linear extent in the widthwise direction of the at least one membrane segment corresponds to an integral multiple of the sum of the width of the facet element and the distance in the widthwise direction between adjacent facet elements. Adjacent webs of the frame are typically arranged at a corresponding distance (i.e. approximately N times or M times the linear extent of a facet element) from one another.

In the case of facet mirrors, the facet elements are often arranged in groups of N×M facet elements, the distance between adjacent groups being greater than the distance between adjacent facet elements. In order to keep the shading as low as possible, it may be advantageous to choose the linear extent of the membrane segments in such a way that the linear extent of a membrane segment corresponds to an integral multiple or exactly the linear extent of such a group of N×M facet elements.

In one embodiment, the membrane is formed from silicon, in particular from polysilicon. It has been found that this material has a low absorption, and consequently a high transmission, with respect to EUV radiation. A thin membrane of (poly)silicon may for example have a mean transmission of more than 85% of the incident EUV radiation.

In a further embodiment, the membrane segments have on a side facing away from the optical element a coating that reduces the attachment of contaminating substances. The material of the membrane that is optimized with regard to the transmission of EUV radiation is typically not optimized with regard to lowest possible attachment of contaminating substances, and so it has proven to be advantageous to apply to the membrane a coating with which the attachment of contaminating substances is less than in the case of the material of the membrane.

In one embodiment, the material of the coating is selected from the group comprising: oxides, nitrides, carbides and borides. The choice of a suitable material for the coating depends on the type or chemical composition of the contaminating substances from which the optical element is to be protected, for example tin contaminants. In the case of certain types of contaminating substances, the coating should typically not comprise any (pure) metals. When using the optical assembly for EUV lithography, the coating of the membrane must withstand the vacuum conditions in an EUV lithography system.

In a further embodiment, the material of the coating is selected from the group: titanium oxide, zirconium oxide, yttrium oxide, cerium oxide, niobium oxide, lanthanum oxide, vanadium oxide, chromium oxide, manganese oxide, aluminum oxide, cobalt oxide, molybdenum oxide and tungsten oxide. These materials have proven to be advantageous in particular for reducing the attachment of tin contaminants (in the form of tin or for example tin hydrides). For example, it has been found in experiments that the surface region or the volume of tin particles that attach themselves to a surface coated with $ZrO_2$ was reduced when it was exposed to a hydrogen plasma such as that which is induced in the vacuum environment of an EUV lithography system, for example by EUV radiation.

In addition or as an alternative to a coating for providing protection from contaminating substances, the membrane may have a functional coating that serves another purpose. For example, the coating may serve as a spectral filter, in order to filter out the desired EUV wavelength range from the radiation emitted by the EUV light source. A coating which performs the function of a neutral grey filter is also possible.

In a further embodiment, the membrane segments each have a thickness of between 5 nm and 500 nm. As described further above, the membrane segments should not have too great a thickness, in order to make it possible for the membrane to have the highest possible transmission of the EUV radiation. However, the thickness of the membrane should also not be chosen to be too small, in order to prevent the membrane from tearing through, for example when too great an amount of contaminating substances becomes attached.

In another embodiment, the protective element is mounted in the optical assembly in a detachable way, i.e. via a detachable connection, e.g. a screw connection, a clamping connection, etc. The optical assembly may comprise a mounting which holds the protective element at a predetermined distance from the surface of the optical element, the protective element being connected to the mounting in a detachable manner. In this way, the protective element may be replaced in a cost-saving and time-saving manner without having to replace the optical element. Replacement of the protective element may be required e.g. when an excessive amount of contaminating substances has accumulated on the side of the membrane segments facing away from the optical element.

In a further embodiment, the optical assembly comprises a purge device for purging a space between the optical element and the side of the membrane that is facing the optical element with a purge gas. The space between the membrane and the optical element forms a so-called mini-environment which is separated from the remainder of the (vacuum) environment of the optical arrangement in which the optical assembly is arranged. The space between the membrane and the optical element may be separated from the environment in a gas-tight manner, but this is not necessarily the case. In either case, by providing a dedicated purge gas flow through the space, contaminating substances which are outgassed from the optical element may be prevented from reaching the vacuum environment outside of the mini-environment. The purge device typically has a nozzle from which the purge gas flows out into the space between the membrane and the optical element. The purge device may also comprise a suction unit for removing the purge gas from the space between the optical element and the membrane. A plurality of gases may be used as a purge gas. For instance, hydrogen or noble gases such as helium may be used, but also heavier gases having a larger molecular weight such as nitrogen may be used. These heavier gases can be applied as purge gases despite their typically higher light absorption per length of optical path at similar pressures (higher than, e.g. hydrogen), without too much loss of light intensity of the EUV light beam, because the length the light beam has to pass (twice) in the space between the optical surface and the nearby membrane is limited (typically in the range of only a few mm).

A further aspect of the invention relates to an optical arrangement, in particular an EUV lithography system, comprising at least one optical assembly as described further above. The optical assembly or the optical assemblies may serve in particular for the protection of optical elements that have a comparatively large optically used surface. This is typically the case with facet mirrors in the illumination system of an EUV lithography apparatus, but also other, possibly faceted optical elements can be effectively protected from contaminating substances by the protective element described further above.

In one embodiment, the optical arrangement has at least one cleaning device for removing contaminating substances from a side of the membrane that is facing away from the optical element. The cleaning device is designed to bring the side of the membrane that is facing away from the optical element into contact with a cleaning agent, in particular with a cleaning gas, for example with (possibly activated) hydrogen. The cleaning device typically has in this case a nozzle, from which the cleaning gas flows out and impinges on the side of the membrane that is facing away from the optical element. For this purpose, the cleaning gas is typically removed from a gas reservoir and fed to the nozzle. The part of the cleaning device with the nozzle may possibly be moved in the optical arrangement, in order to clean different partial regions of the membrane, or in order to make it possible that the nozzle or the entire cleaning device is arranged outside the beam path during the operation of the optical arrangement. The contaminating substances may be particles or molecular contaminants.

In one embodiment, the optical arrangement has an illumination system and the optical assembly is arranged in the illumination system, the optical element of the optical assembly being formed by a facet mirror of the illumination system.

As described further above, by the nature of their construction, facet mirrors have a relatively large surface. Since the facet elements of such facet mirrors are typically actuated by mechanical or electromechanical components, which can possibly be damaged by the contaminating substances, it is advantageous to protect such a facet mirror from contaminating substances.

Further features and advantages of the invention emerge from the following description of exemplary embodiments of the invention, on the basis of the figures in the drawing, which show details essential to the invention, and from the claims. The individual features can be realized respectively on their own or together in any combination in one variant of the invention.

BRIEF DESCRIPTION OF THE DRAWINGS

Exemplary embodiments are illustrated in the schematic drawing and are explained in the following description. In the figures

DETAILED DESCRIPTION

Identical reference signs are used in the following description of the drawings for components that are the same or functionally the same.

Figure 1:
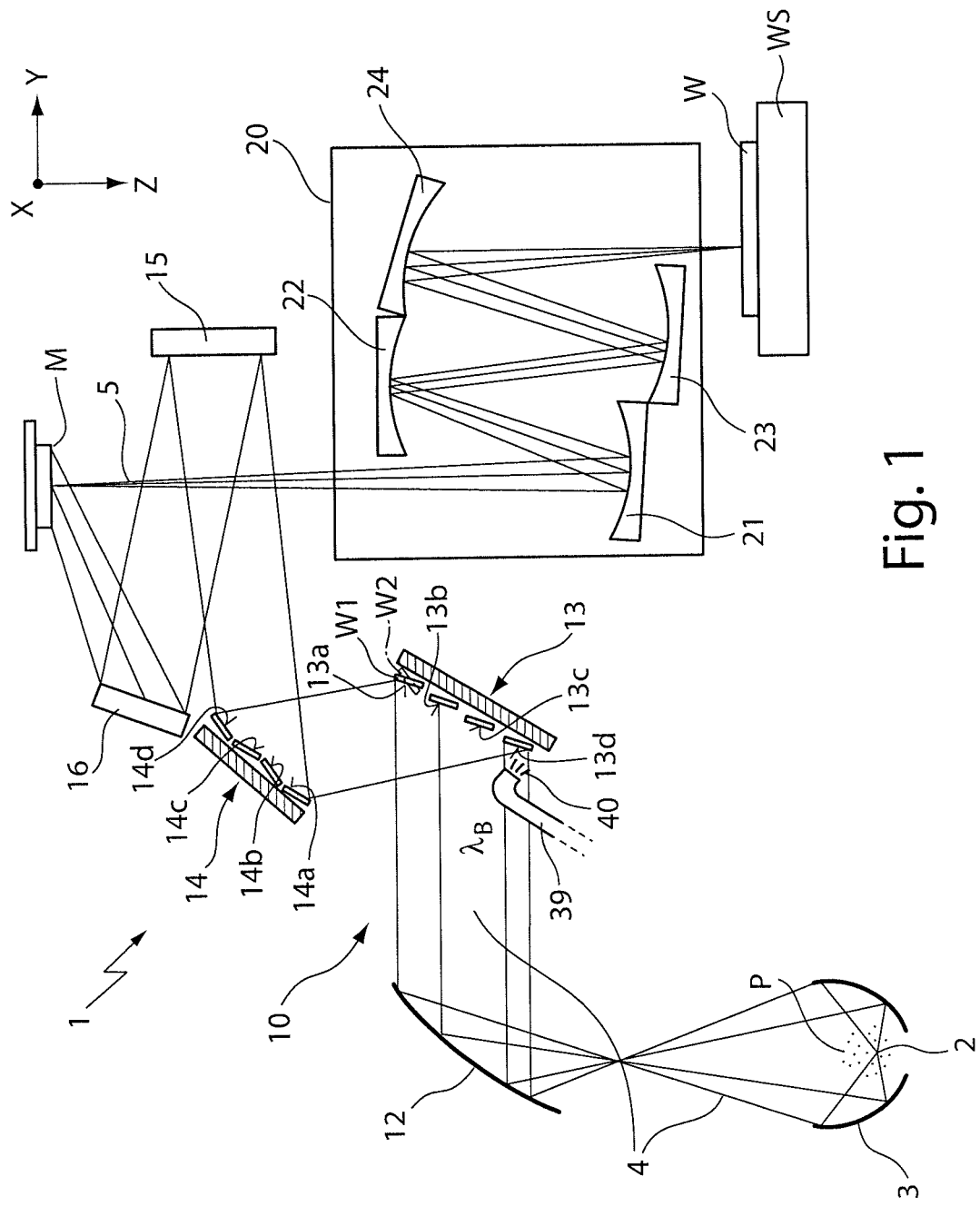
FIG. 1 shows a schematic illustration of an EUV lithography apparatus with two facet mirrors.

In FIG. 1, an optical arrangement in the form of an EUV lithography system, to be more precise an EUV lithography apparatus 1, is schematically shown. It has an EUV light source 2 for generating EUV radiation, which has a high energy density in an EUV wavelength range below 50 nm, in particular between about 5 nm and about 15 nm. The EUV light source 2 may for example take the form of a plasma light source for generating a laser-induced plasma or be formed as a synchrotron radiation source. In particular in the former case, a collector mirror 3 may be used, as shown in FIG. 1, in order to focus the EUV radiation of the EUV light source 2 into an illumination beam 4 and in this way increase the energy density further. The illumination beam 4 has a wavelength spectrum, which is concentrated in a narrow-band wavelength range around an operating wavelength $\lambda_B$, at which the EUV lithography apparatus 1 is operated. A monochromator 12 is used for selecting the operating wavelength $\lambda_B$ or for selecting the narrowband wavelength range.

The illumination beam 4 serves for the illumination of a structured object M by an illumination system 10, which in the present example has four reflective optical elements 13 to 16. The structured object M may be for example a reflective mask M, which has reflective and non-reflective, or at least much less reflective, regions for producing at least one structure on the object M. Alternatively, the structured object M may be a plurality of micro-mirrors, which are arranged in a one-dimensional or multi-dimensional arrangement and which are possibly movable about at least one axis, in order to set the angle of incidence of the EUV radiation 4 on the respective mirror.

The structured object M reflects part of the illumination beam 4 and forms a projection beam 5, which carries the information about the structure of the structured object M and is radiated into a projection system 20, which produces a projected image of the structured object M or of a respective partial region thereof on a substrate W, for which purpose four reflective optical elements 21 to 24 are arranged in the projection system 20. The substrate W, for example a wafer, comprises a semiconductor material, for example silicon, and is arranged on a mounting, which is also referred to as a wafer stage WS.

The first and second reflective elements in the illumination system 10 are in the present case formed as segmented mirrors in the form of facet mirrors 13, 14 and have a plurality of facet elements 13a-d, 14a-d in the form of micro-mirrors, which are respectively arranged in a raster arrangement. For each facet mirror 13, 14, four facet elements 13a-d, 14a-d, at which the illumination beam 4 or a respective partial beam of the illumination beam 4 is reflected, are shown by way of example in FIG. 1. The first optical element 13 is subsequently also referred to as the field facet mirror 13 and serves for producing secondary light sources in the illumination system 10. The second optical element 14 is typically arranged at the location of the secondary light sources produced by the first optical element 13 and is subsequently also referred to as the pupil facet mirror 14.

A partial beam of the illumination beam 4 that is incident on a respective facet element 13a-d of the field facet mirror 13 is deflected athereby onto a respective facet element 14a-d of the pupil facet mirror 14. The facet elements 13a-d of the field facet mirror 13 may be rectangular and have an aspect ratio (x:y) of for example 20:1 or less, the X direction extending perpendicularly to the plane of the drawing of FIG. 1. The aspect ratio of the facet elements 13a-d corresponds here to the aspect ratio of the illumination field that is illuminated by the illumination system 10, and is for example rectangular. Illumination fields or facet elements 13a-d with a geometry other than rectangular are likewise possible.

Each of the facet elements 13a-d of the field facet mirror 13 may in the present case be tilted about an axial direction parallel to the X direction, as indicated by way of example in FIG. 1 by two angular positions W1, W2 of the first facet element 13a of the field facet mirror 13. In addition, a respective facet element 13a-d may possibly also be tiltable about a further axis that lies in the XZ plane (plane of the drawing). In this way, the direction in which the illumination beam 4 is incident on the facet elements 13a-d can be set. The tilting can also have the effect in particular of changing the assignment between the facet elements 13a-d of the field facet mirror 13 and the facet elements 14a-d of the pupil facet mirror 14, in order to produce a desired illumination distribution (illumination pupil or angular distribution) at the location of the illuminated object M. Correspondingly, the facet elements 14a-d of the pupil facet mirror 14 may also be tiltable about an axial direction parallel to the X direction and possibly about a further axis that lies in the XZ plane (plane of the drawing).

In the example shown, the EUV light source 2 is formed as a plasma light source for generating a laser-induced plasma on a target material, which takes the form of tin droplets. During the formation of the plasma, some of the tin material of the EUV light source 2 transitions into the gas phase and forms contaminating substances P in the form of tin contaminants, for example tin particles or tin compounds, in particular tin hydrides ($Sn_xH_y$). The contaminating substances P may spread out in the EUV lithography apparatus 1 from the EUV light source 2 to optical elements, for example to the field facet mirror 13 or to the pupil facet mirror 14, and be deposited on them or contaminate them.

Figure 2:
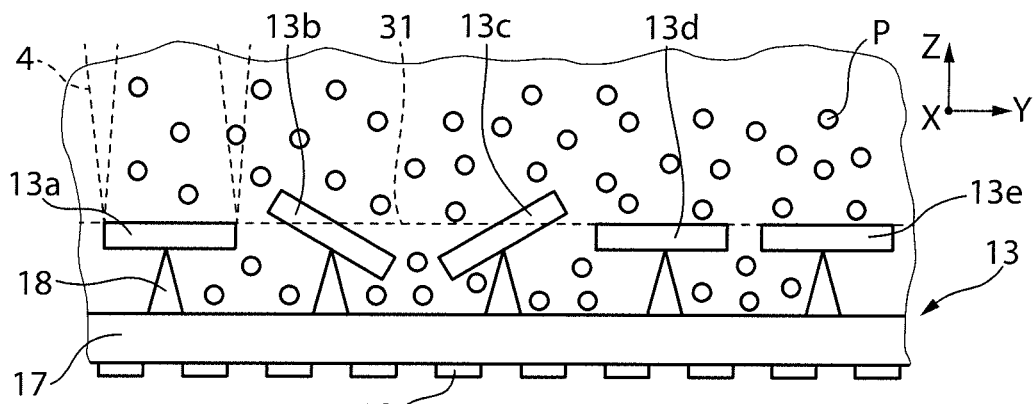
FIG. 2 shows a schematic illustration of a detail of a facet mirror from FIG. 1, the surface of which is exposed to contaminating substances, in a side view.

FIG. 2 shows a detail of the field facet mirror 13 from FIG. 1, with by way of example five facet elements 13a-e, which are exposed to the contaminating substances P. As can be seen in FIG. 2, the field facet mirror 13 has a substrate 17 of silicon, which has columnar supporting elements 18, on which the facet elements 13a-e are movably mounted. Mounted underneath the substrate 17 in the region of each facet element 13a-e is/are one or more actuators 19, for example in the form of electrodes, for producing an electrical field, in order to tilt the facet elements 13a-e with electrostatic attraction about an axis that extends in the X direction and runs in the region of a respective supporting element 18.

As can be seen in FIG. 2, the contaminating substances P may not only be deposited on the surfaces of the facet elements 13a-e themselves, on which a coating that reflects the EUV radiation 4 has been applied, but may also enter an intermediate space between adjacent facet elements 13a-e and settle on a respective supporting element 18 and/or on the substrate 17 of the facet mirror 13. This applies in particular if individual facet elements 13a-e are tilted out of a common plane, indicated in FIG. 2 by dashed lines, as is the case with the second and third facet elements 13b, 13c shown in FIG. 2.

The deposition of contaminating substances P in the form of tin particles may change the electrical potential on the surface of the supporting elements 18, whereby the actuation or tilting of the facet elements 13a-e by the actuators 19 is impaired. In particular, the angular range in which the actuation of the facet elements 13a-e is possible may be restricted by the deposition of the contaminating substances P.

Figure 3:
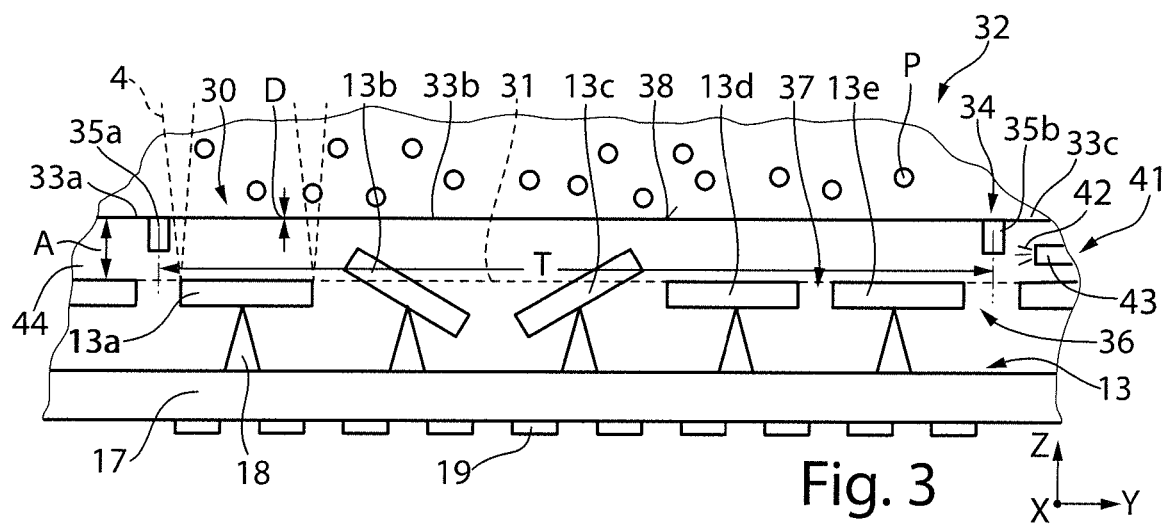
FIG. 3 shows a schematic illustration of a detail of a facet mirror from FIG. 1, the surface of which is protected from contaminating substances by a protective element with a number of membrane segments, in a side view.

FIG. 3 shows the facet mirror 13 from FIG. 2, arranged in front of which is a protective element 30, which protects the facet mirror 13, to be more precise the planar surface 31 thereof, which is illustrated in FIG. 3 by dashed lines and along which the facet elements 13a-e in the non-tilted state are arranged with their upper sides facing the EUV radiation 4, from the contaminating substances P. Together with the protective element 30, the facet mirror 13 forms an optical assembly 32.

In the example shown, the protective element 30 has a membrane, which is formed by a plurality of membrane segments 33a-c, of which three membrane segments 33a-c are at least partially illustrated in FIG. 3 by way of example. The protective element 30 additionally has a frame 34 in the form of a (wire) grid, of which only two webs 35 are illustrated in FIG. 3. A first membrane segment 33a, which is on the left in FIG. 3, and a second membrane segment 33b, which is in the middle in FIG. 3, are fastened at the edge to a first web 35a. Correspondingly, the middle membrane segment 33b and a membrane segment 33c that is on the right in FIG. 3 are fastened at the edge to a second web 35b. The fastening of the membrane segments 33a-c to the webs 35a,b may take place by adhesive bonding or in some other way.

In the example shown, adjacent membrane segments 33a,b; 33b,c directly adjoin one another, and so the entire upper side of the webs 35a, 35b is covered by the membrane segments 33a-c. As can likewise be seen in FIG. 3, the middle membrane segment 33b covers a partial region T of the surface 31 that comprises the five facet elements 33a-e illustrated in FIG. 3 and protects it from the contaminating substances P. The same applies to the first and third membrane segments 33a, 33c, which likewise cover a respective partial region of the surface 31, as can be seen in particular from FIG. 4, which shows the optical assembly 32 in a plan view from above, i.e. looking onto the protective element 30.

Figure 4:
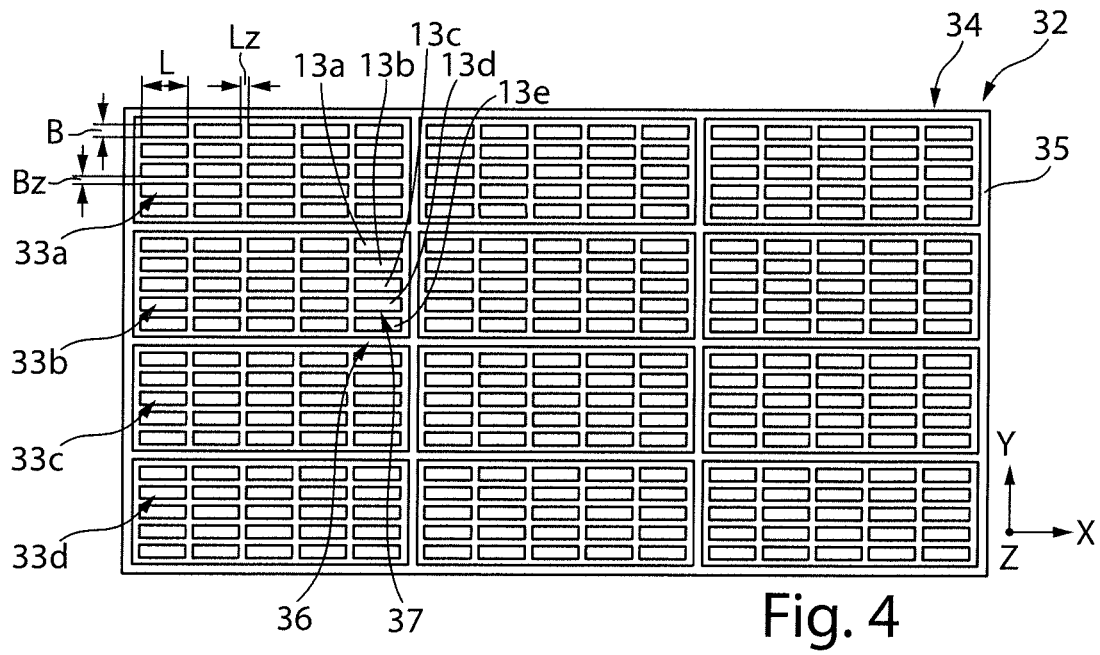
FIG. 4 shows a schematic illustration of the facet mirror from FIG. 1 with the protective element arranged in front of the surface thereof, in a plan view.

In FIG. 4, the grid-shaped frame 34 of the protective element 30 can be seen, in the example shown comprising five webs arranged in parallel in the longitudinal direction and four webs arranged in parallel in the transverse direction, which are respectively connected to one another at grid nodes. Between every two webs 35 that are adjacent in the longitudinal direction or in the transverse direction there is respectively arranged one of altogether twelve membrane segments, which cover in a planar manner the surface 31 to be protected of the field facet element 13.

In FIG. 4, only a first membrane segment 33a to a fourth membrane segment 33d in the transverse direction of the field facet mirror 13 are denoted by way of example. In the example shown, the field facet mirror 13 arranged under the protective element 30 has a grid-shaped arrangement of 15×20 facet elements, of which only five facet elements 13a-e, arranged in a common column, are denoted by reference signs in FIG. 4. The number of 15×20 facet elements has been chosen merely for purposes of illustration; the actual number of facet elements may well be much greater.

In the case of the field facet mirror 13 shown in FIG. 4, the facet elements are respectively arranged in groups of 5×5 facet elements, between which there is formed an intermediate space 36 (cf. also FIG. 3), which is typically larger than an intermediate space 37 between adjacent facet elements 13a-e of the same group. A respective membrane element 35a-c covers a group of 5×5 facet elements, the webs 35 of the frame 34 being arranged over the intermediate spaces 36 (see also FIG. 3) between adjacent groups of facet elements. In this way, only a partial region of the surface 31, which in any case cannot contribute to the reflection of EUV radiation 4 since no facet elements 13a-e are arranged there, is shaded by the frame 34, to be more precise by the webs 35.

In order also in the case of EUV radiation 4 that is possibly obliquely incident on the surface 31 of the field facet mirror 13 to prevent the webs 35 of the frame 34, which are formed from a material that is not transparent to the EUV radiation 4, for example from aluminum, from being able to shade the reflective surfaces of the facet elements 13a-e, it is advantageous if the protective element 30 is arranged at a comparatively small distance A from the surface 31 of the facet mirror 13, which may for example be less than 10 mm, preferably less than 5 mm, particularly preferably less than 2 mm, and which is at least great enough that a tilted facet element 13b, 13c does not bump into the protective element 30 or a respective membrane segment 33a-c. The distance between the protective element 30 and the surface 31 to be protected is measured here between the respective membrane segments 33a-c, to be more precise between the side thereof that is facing the field facet mirror 13, and the surface 31.

The protective element 30 of the optical assembly 32, to be more precise the frame 34 of the protective element 30, may be fastened to a mounting, to which the field facet element 13 itself is also fastened, but it is also possible that the field facet element 13 and the frame 34 are fastened to different mountings that are kept at a distance from one another. In either case, the protective element 30 may be fastened to the mounting in a detachable way, i.e. via a detachable connection such as a screw connection or a clamping connection. This facilitates the removal of the protective element 30 from the EUV lithography apparatus, should this possibly be required because of contamination of the membrane segments 33a-c.

In the case of the example shown in FIG. 4, the geometry, i.e. the length and the width, of the grid-shaped frame 34 is adapted to the geometry, i.e. the length and width, of the facet elements 13a-e, to be precise in such a way that the webs 35 of the frame 34 are arranged over the intermediate spaces 36 between the adjacent groups of facet elements. In the example shown in FIG. 4, a respective facet element 13a-e has a linear extent in the X direction (length) L of about 3 mm and a linear extent in the Y direction (width) B of about 1 mm. The linear extent 5×L, 5×B of a respective membrane segment 33a-c corresponds approximately to an integral multiple of the length L and the width B of a respective facet element 13a-e. On account of the intermediate spaces 37 between the adjacent facet elements 13a-e, the length and the width of a respective membrane segment 33a-c are typically slightly greater than an integral multiple of the length L and the width B of a respective facet element 13a-e, i.e. 5×(L+Lz) and 6×(B+Bz), where Lz, Bz denote the length and the width of a respective intermediate space 37 between adjacent facet elements 13a-e.

Unlike the situation shown in FIG. 4, a respective membrane element 33a-c may cover a smaller number of facet elements, in particular only a single facet element 13a-e. In this case, the aspect ratio, i.e. the ratio of length to width, of a respective partial region of the frame 34 that is delimited by four webs 35 substantially coincides with the aspect ratio, i.e. the ratio of length to width, of the respectively covered facet element 13a-e.

In the example shown, the membrane segments 33a-c, which together cover the surface 31 of the field facet mirror 13, are formed from polycrystalline silicon, which has a low absorption with respect to the EUV radiation 4. In spite of the low absorption of the silicon, the membrane segments 33a-c should not have too great a thickness D, typical values for the thickness D lying between about 5 nm and about 500 nm.

In order to prevent contaminating substances P from being deposited on the membrane segments 33a-c and to reduce the probability of such a deposition, in the case of the example shown in FIG. 3 a coating 38 has been applied to the membrane segments 33a-c on the side thereof that is facing away from the field facet mirror 13. Fewer contaminating particles P are deposited on the coating 38 than would be the case with the uncoated material of the membrane segments 33a-c. Oxides, nitrides, carbides and borides have been found to be advantageous as the material for the coating 38. In order to reduce the probability of the deposition of contaminating substances P in the form of tin contaminants, oxides have proven in particular to be advantageous as coating materials, for example titanium oxide, zirconium oxide, yttrium oxide, cerium oxide, niobium oxide, lanthanum oxide, vanadium oxide, chromium oxide, manganese oxide, aluminum oxide, cobalt oxide, molybdenum oxide and tungsten oxide. In particular in the case of a coating 38 of $ZrO_2$, it has been found that a surface region affected by tin contamination was reduced in the size of its surface area under the effect of EUV radiation 4. The probability of (molecular) tin contaminants being deposited on the surface of a coating 38 of $ZrO_2$ during the exposure operation of the EUV lithography system 1 is therefore very low.

The optical assembly 32 with the field facet mirror 13 that is shown in FIG. 3 and FIG. 4 may be arranged in the illumination system 10 of the EUV lithography apparatus 1 from FIG. 1. As can be seen in FIG. 1, the EUV lithography apparatus 1 has a cleaning device 39 for removing contaminating substances P from a side facing away from the optical element 13 of the membrane 33a-c of the optical assembly 32 that is shown in FIG. 3. The cleaning device 39 is designed to direct a cleaning gas 40, for example (possibly activated) hydrogen, onto the optical element 13. For this purpose, the cleaning device 39 has a nozzle, from which the cleaning gas 40 flows out and impinges on the side facing away from the optical element 13 of the membrane 33a-c that is shown in FIG. 3. For this purpose, the cleaning gas 40 is extracted from a gas reservoir (not shown in FIG. 1). In the example shown, the cleaning device 39, or at least the partial region from which the cleaning gas 40 leaves, can be moved within the EUV lithography apparatus 1, in order to clean different partial regions of the membrane 33a-c or prevent the cleaning device 39 from protruding into the illumination beam 4 of the illumination system 10 during exposure operation.

As can be gathered from FIG. 3, in order to avoid contaminating substances which may be outgassed by the optical element 13 or by the actuators 19 from reaching the vacuum environment of the EUV lithography system 1, the optical assembly 32 comprises a purge device 41 for purging a space 44 between the optical element 13 and the side of the membrane 33a-c that is facing the optical element 13 with a purge gas 42. For this purpose, the purge gas 42 is extracted from a gas reservoir and provided to a nozzle 43 of the purge device 41 from which the purge gas 42 flows out into the space 44. In the example shown in FIG. 3, the space 44 between the membrane 33a-c and the optical element 13 is separated from the remainder of the vacuum environment of the EUV lithography system 1 in a gas-tight manner. The purge device 41 has a suction unit (not shown) for removing the purge gas 42 from the space 44. A plurality of gases may be used as a purge gas 42, for instance, hydrogen, noble gases such as helium or gases having a larger molecular weight such as nitrogen.

A further optical assembly, which contains the pupil facet mirror 14 as an optical element, may be arranged in the illumination system 10 from FIG. 1. Also, the mirrors 21 to 24 in the projection system 20 or in other optical arrangements, for example in EUV lithographic metrology systems, can be provided with corresponding protective elements 30 in order to protect them from contaminating substances P. Instead of a reflective optical element, a transmissive optical element may also be protected from contaminating substances with a protective element. In particular, the area of use of such a protective element is not restricted to EUV lithography applications.

What is claimed is:
1. Optical assembly, comprising:
an optical element configured to reflect radiation, and
a protective element configured to protect a surface of the optical element from contaminating substances, the protective element comprising a membrane and a frame on which the membrane is mounted,
wherein:
the optical element is a facet mirror with a plurality of facet elements,
the frame has a first geometrical shape adapted to a second geometrical shape of the facet elements, and
the membrane is a multi-part membrane formed by a plurality of membrane segments, which respectively protect partial regions of a surface of the optical element from the contaminating substances.

2. Optical assembly according to claim 1, wherein the frame has a plurality of webs configured to fasten respective ones of the membrane segments at respective edges of the membrane segments.

3. Optical assembly according to claim 2, wherein the webs of the frame are arranged over intermediate spaces between the facet elements.

4. Optical assembly according to claim 1, wherein the optical element is configured to reflect extreme ultraviolet (EUV) radiation.

5. Optical assembly according to claim 1, wherein the optical element has at least one actuator configured to move at least respective ones of the partial regions of the surface.

6. Optical assembly according to claim 1, wherein a distance between the surface of the optical element and the protective element is less than 10 mm.

7. Optical assembly according to claim 6, wherein the distance between the surface of the optical element and the protective element is less than 2 mm.

8. Optical assembly according to claim 1, wherein a linear extent of at least one of the membrane segments corresponds at least substantially to an integral multiple of a linear extent of one of the facet elements.

9. Optical assembly according to claim 1, wherein a linear extent in a longitudinal direction of at least one of the membrane segments corresponds to an integral multiple of a sum of a length of a facet element and a distance in the longitudinal direction between adjacent ones of the facet elements and in which the linear extent in a widthwise direction of the at least one membrane segment corresponds to an integral multiple of a sum of a width of one of the facet elements and a distance in a widthwise direction between adjacent ones of the facet elements.

10. Optical assembly according to claim 1, wherein the membrane segments are formed from silicon.

11. Optical assembly according to claim 10, wherein the silicon is a polycrystalline silicon.

12. Optical assembly according to claim 1, wherein the membrane segments have, on respective sides facing away from the optical element a coating configured to reduce attachment of the contaminating substances.

13. Optical assembly according to claim 12, wherein the coating comprises at least one material selected from the group consisting essentially of: oxides, nitrides, carbides and borides.

14. Optical assembly according to claim 12, wherein the coating comprises at least one material selected from the group: titanium oxide, zirconium oxide, yttrium oxide, cerium oxide, niobium oxide, lanthanum oxide, vanadium oxide, chromium oxide, manganese oxide, aluminum oxide, cobalt oxide, molybdenum oxide and tungsten oxide.

15. Optical assembly according to claim 1, wherein the membrane segments each have a thickness of between 5 nm and 500 nm.

16. Optical assembly according to claim 1, wherein the protective element is detachably mounted in the optical assembly.

17. Optical assembly according to claim 1, further comprising: a purge device configured to purge a space between the optical element and a side of the membrane that faces the optical element with a purge gas.

18. Optical arrangement, comprising: at least one optical assembly according to claim 1.

19. Optical arrangement according to claim 18, further comprising: a cleaning device configured to remove the contaminating substances from a side of the membrane that faces away from the optical element.

20. Optical arrangement according to claim 18, comprising: an illumination system, wherein the optical assembly is arranged in the illumination system.

21. Optical arrangement as claimed in claim 18, wherein the optical arrangement is an EUV lithography system.

22. Optical assembly according to claim 1, wherein the plurality of membrane segments are separated from one another by the frame, wherein the plurality of membrane segments cover the surface of the optical element that is irradiated by radiation.

23. Optical assembly according to claim 1, wherein the plurality of facet elements are divided into a plurality of groups with a first intermediate space between each of the plurality of groups, wherein each of the plurality of facet elements are separated from one another with a second intermediate space smaller than the first intermediate space, and wherein the frame is adapted to length and width dimensions of the plurality of facet elements.

24. Optical assembly according to claim 23, wherein the frame has a plurality of webs located at the first intermediate space and wherein the optical element has a plurality of actuators, each configured to move, via at least respective ones of a plurality of supporting elements, at least respective ones of the plurality of facet elements.

\* \* \* \* \*

UNITED STATES PATENT AND TRADEMARK OFFICE
CERTIFICATE OF CORRECTION

| | |
|---|---|
| PATENT NO. | : 11,022,893 B2 |
| APPLICATION NO. | : 15/965913 |
| DATED | : June 1, 2021 |
| INVENTOR(S) | : Ehm et al. |

It is certified that error appears in the above-identified patent and that said Letters Patent is hereby corrected as shown below:

On the Title Page

Page 2, Column 2, under OTHER PUBLICATIONS, Line 1, Delete "1020152212092," and insert -- 102015221209.2, --, therefor.

In the Specification

Column 2, Line 55, After "substances" insert -- . --.

Column 9, Line 36, Delete "athereby" and insert -- thereby --, therefor.

Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*